(12) United States Patent
Seo et al.

(10) Patent No.: US 9,135,981 B2
(45) Date of Patent: Sep. 15, 2015

(54) MEMORY SYSTEM HAVING MEMORY RANKS AND RELATED TUNING METHOD

(71) Applicant: SAMSUNG ELECTRONICS CO., LTD., Suwon-Si, Gyeonggi-Do (KR)

(72) Inventors: Eunsung Seo, Seoul (KR); Chul-Sung Park, Seoul (KR); Chi-Sung Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/692,797

(22) Filed: Apr. 22, 2015

(65) Prior Publication Data

US 2015/0228327 A1      Aug. 13, 2015

Related U.S. Application Data

(62) Division of application No. 13/967,506, filed on Aug. 15, 2013, now Pat. No. 9,047,929.

(30) Foreign Application Priority Data

Sep. 18, 2012 (KR) .................. 10-2012-0103457

(51) Int. Cl.
*G11C 29/22* (2006.01)
*G11C 11/4076* (2006.01)
*G11C 17/16* (2006.01)
*G11C 11/4093* (2006.01)

(52) U.S. Cl.
CPC ........ *G11C 11/4076* (2013.01); *G11C 11/4093* (2013.01); *G11C 17/16* (2013.01); *G11C 29/22* (2013.01)

(58) Field of Classification Search
CPC ...... G11C 29/22; G11C 7/10; G11C 11/4076; G11C 11/4093
USPC .................. 365/191, 230.08, 233.1, 233.11
See application file for complete search history.

(56) References Cited

U.S. PATENT DOCUMENTS

| | | | |
|---|---|---|---|
| 7,692,983 B2 * | 4/2010 | Lee et al. | 365/198 |
| 7,839,716 B2 | 11/2010 | Kong et al. | |
| 2004/0105292 A1 | 6/2004 | Matsui | |
| 2010/0162020 A1 | 6/2010 | Maule et al. | |
| 2010/0269012 A1 | 10/2010 | Hazelzet | |
| 2011/0161581 A1 | 6/2011 | Shin | |

* cited by examiner

*Primary Examiner* — Jason Lappas
(74) *Attorney, Agent, or Firm* — Volentine & Whitt, PLLC

(57) ABSTRACT

A memory device comprises at least two memory ranks sharing input/output lines, at least one mode register configured to store bits used to tune delays of data signals of the at least two ranks output through the input/output lines, a controller configured to determine tuning parameters for the data signals based on the stored bits in the at least one mode register, the tuning parameters comprising at least the delays of the data signals, and at least one nonvolatile memory disposed in at least one of the at least two memory ranks and configured to store the tuning parameters.

9 Claims, 14 Drawing Sheets

| | A16 | BA1 | BA0 | A15 | A14 | A13 | A12 | A11 | A10 | A9 | A8 | A7 | A6 | A5 | A4 | A3 | A2 | A1 | A0 |
|---|---|---|---|---|---|---|---|---|---|---|---|---|---|---|---|---|---|---|---|
| MR0 | 0 | 0 | 0 | 0 | | | | | | Write Latency | | TM | Read Latency | | | 0 | | Burst Length | |
| MR1 | 0 | 0 | 1 | Currently only one register is defined at A[15:0] = 0, DQ0-20 is used for SRR ||||||||||||||||
| MR2 | 0 | 1 | 0 | 0 | | | | | | | nWR | | TM | Drive Strength | | 0 | | | Thermal Offset |
| MR3 | 0 | 1 | 1 | PASR |||||||||||||||
| MR4 | 1 | 0 | 0 | Reserved for future use |||||||||||||||
| MR5 | 1 | 0 | 1 | 0 | | | | | | | | | DQ/DQS Tuning |||||||
| MR6 | 1 | 1 | 0 | Reserved for future use |||||||||||||||
| MR7 | 1 | 1 | 1 | PASR |||||||||||||||

FIG. 9

| DQ17 | DQ16 | |
|---|---|---|
| 0 | 0 | no steps (factory tuning) |
| 0 | 1 | 8 steps |
| 1 | 0 | 16 steps |
| 1 | 1 | 32 steps |

FIG. 10

| A16 | BA1 | BA0 | A1 | A0 | |
|---|---|---|---|---|---|
| 1 | 0 | 1 | 0 | 0 | Do not change delay |
| 1 | 0 | 1 | 0 | 1 | Increase +CK to DQ delay 1 element |
| 1 | 0 | 1 | 1 | 0 | Decrease +CK to DQ delay 1 element |
| 1 | 0 | 1 | 1 | 1 | Remove all +CK to DQ delay |

FIG. 11

| A16 | BA1 | BA0 | A3 | A2 | |
|---|---|---|---|---|---|
| 1 | 0 | 1 | 0 | 0 | Do not change delay |
| 1 | 0 | 1 | 0 | 1 | Increase -CK to DQS delay 1 element |
| 1 | 0 | 1 | 1 | 0 | Decrease -CK to DQS delay 1 element |
| 1 | 0 | 1 | 1 | 1 | Remove all -CK to DQS delay |

FIG. 12

| A16 | BA1 | BA0 | A7 | A6 | A5 | A4 | |
|---|---|---|---|---|---|---|---|
| 1 | 0 | 1 | 0 | 0 | 0 | 1 | place +CK/2 on DQ8, -CK/2 on DQS0 |
| 1 | 0 | 1 | 0 | 0 | 1 | 0 | place +CK/2 on DQ24, -CK/2 on DQS1 |
| 1 | 0 | 1 | 0 | 1 | 0 | 0 | place +CK/2 on DQ40, -CK/2 on DQS2 |
| 1 | 0 | 1 | 1 | 0 | 0 | 0 | place +CK/2 on DQ56, -CK/2 on DQS3 |
| 1 | 0 | 1 | 0 | 0 | 0 | 0 | normal DQ/DQS functionality |

FIG. 16
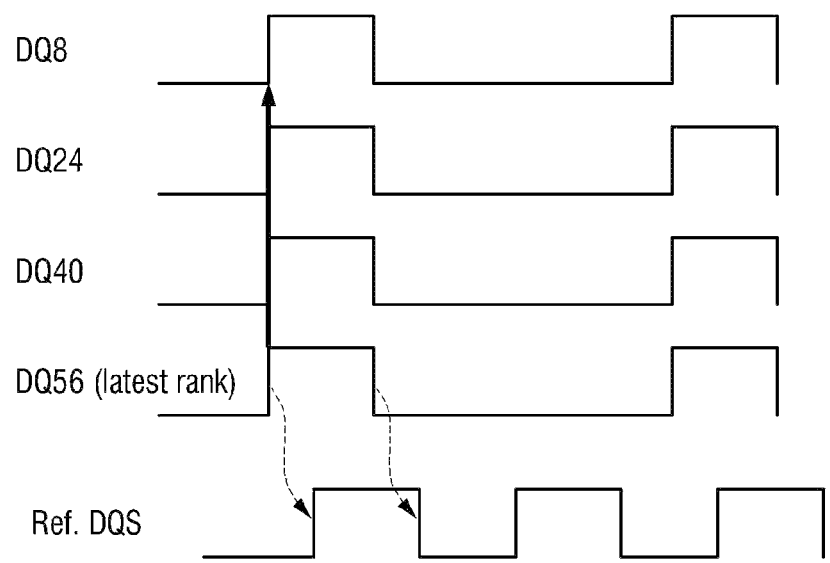
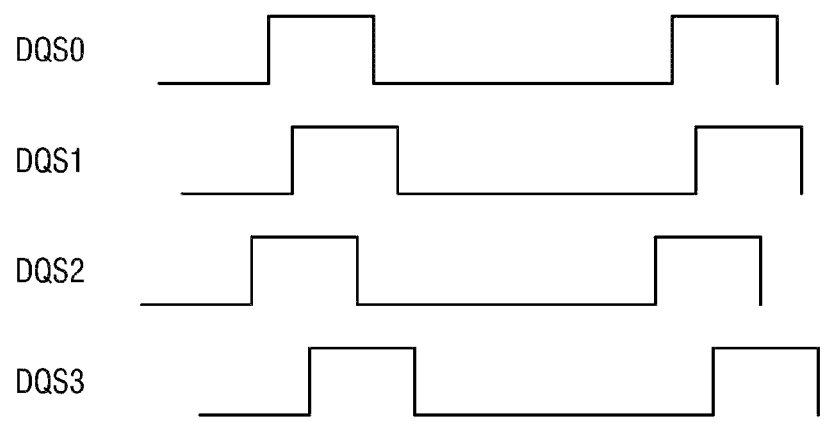

US 9,135,981 B2

MEMORY SYSTEM HAVING MEMORY RANKS AND RELATED TUNING METHOD

CROSS-REFERENCE TO RELATED APPLICATIONS

This application is a Divisional of U.S. application Ser. No. 13/967,506, filed Aug. 15, 2013, which claims priority under 35 U.S.C. §119 to Korean Patent Application No. 10-2012-0103457 filed on Sep. 18, 2012, the subject matter of which is hereby incorporated by reference.

BACKGROUND OF THE INVENTION

The inventive concept relates generally to electronic memory technologies. More particularly, certain embodiments of the inventive concept relate to memory systems having memory ranks and methods of tuning electrical parameters of the memory ranks.

A memory rank is a set of memories that are accessed concurrently. As an example, a memory rank may comprise multiple dynamic random access memory (DRAM) chips connected to the same chip select signal to allow concurrent access to the chips. Memory ranks are commonly used, for instance, in memory modules comprising several memory chips.

In general, the concurrent access of different memory chips in a memory rank requires an ability to control the timing and other aspects of access operations. As memory systems become increasingly intricate and/or complex, there is a general need for new techniques for performing these control operations.

SUMMARY OF THE INVENTION

In one embodiment of the inventive concept, a memory device comprises at least two memory ranks sharing input/output lines, at least one mode register configured to store bits used to tune delays of data signals of the at least two ranks output through the input/output lines, a controller configured to determine tuning parameters for the data signals based on the stored bits in the at least one mode register, the tuning parameters comprising at least the delays of the data signals, and at least one nonvolatile memory disposed in at least one of the at least two memory ranks and configured to store the tuning parameters.

In another embodiment of the inventive concept, a tuning method for a memory device comprises operating least two memory ranks sharing input/output lines to generate pulses having a same phase from different DQ and DQS pins, generating a reference DQS pulse having a phase difference of 90 degrees from a latest DQ pulse among DQ pulses of the at least two memory ranks, aligning phases of DQ pulses of the at least two memory ranks by increasing or decreasing DQ delays based on the latest DQ pulse, aligning phases of DQS pulses with the at least two ranks by increasing or decreasing DQS delays based on the reference DQS pulse, and storing increasing or decreasing results of the DQ delay and the DQS delay in a nonvolatile memory.

In yet another embodiment of the inventive concept, a memory device comprises at least one memory rank comprising a plurality of memory chips, at least one mode register configured to store bits used to tune electrical parameters of data signals of the at least two ranks output through the input/output lines, a controller configured to tune the electrical parameters based on the stored bits in the at least one mode register, the electrical parameters comprising alternating current (AC) timing parameters, and at least one nonvolatile memory disposed in at least one of the at least two memory ranks and configured to store the electrical parameters.

These and other embodiments of the inventive concept can potentially improve the performance of a device by storing tuned electrical parameters in a nonvolatile memory for relatively efficient access.

BRIEF DESCRIPTION OF THE DRAWINGS

The drawings illustrate selected embodiments of the inventive concept. In the drawings, like reference numbers indicate like features.

FIG. 8 is a table illustrating operations of a mode register of the memory system of FIG. 1.

FIG. 9 is a table illustrating operations of a mode register of the memory system of FIG. 1.

FIG. 10 is a table illustrating operations of a mode register of the memory system of FIG. 1.

FIG. 11 is a table illustrating operations of a mode register of the memory system of FIG. 1.

FIG. 12 is a table illustrating operations of a mode register of the memory system of FIG. 1.

FIG. 16 is a timing diagram for the tuning method of FIGS. 13A and 13B.

DETAILED DESCRIPTION

Embodiments of the inventive concept are described below with reference to the accompanying drawings. These embodiments are presented as teaching examples and should not be construed to limit the scope of the inventive concept.

In the description that follows, the terms "a" and "an" and "the" and similar referents are to be construed to cover both singular and plural forms of the corresponding features, unless indicated to the contrary. Unless otherwise defined, all technical and scientific terms used herein have the same meaning as commonly understood by one of ordinary skill in the art. The use of any and all examples, or example terms herein is intended merely to better illuminate the inventive concept and is not a limitation on the scope of the inventive concept unless otherwise specified. Further, unless indicated to the contrary, all terms defined in generally used dictionaries are to be interpreted in proper context and not in an overly formal manner.

Figure 1:
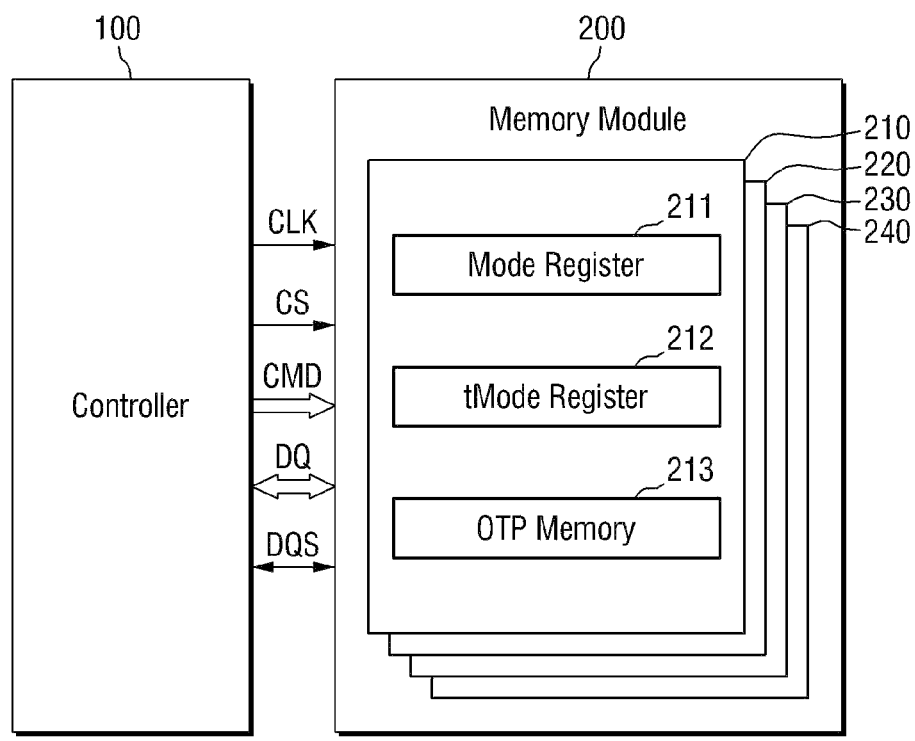
FIG. 1 is a block diagram illustrating a memory system according to an embodiment of the inventive concept.

FIG. 1 is a block diagram illustrating a memory system according to an embodiment of the inventive concept.

Referring to FIG. 1, memory system 1 comprises a controller 100 and a memory module 200.

Controller 100 transmits a clock signal CLK, a select signal CS, and a command signal CMD to memory module 200 to transmit and receive data signals DQ and DQS. Command signal CMD comprises a mode register set (MRS) signal, a tMRS signal, and an OTP signal, which are described in further detail below. Data signal DQ is a bidirectional data bus signal. Data signal DQS is a data strobe signal having a positive-edge and a negative-edge with a phase difference from data signal DQ. In the description that follows, various features related to data signals DQ and DQS will be indicated with labels including the symbols "DQ" and "DQS". For instance, a pulse in a data signal DQ may be referred to as a "DQ pulse", and a clock signal of data signal DQ may be referred to as CLKDQ.

Memory module 200 comprises a plurality of memory chips arranged in an assembly in memory system 1. Memory module 200 comprises a plurality of ranks 210, 220, 230 and 240. Each of the ranks comprises multiple memory chips configured as a coherent logical or physical operational unit of memory module 200. In general, memory module 200 can comprise any number of ranks, but it will be described as having four ranks for convenience. Accordingly, the memory chips of memory module 200 are divided into four groups, and operate by groups of a first rank 210, a second rank 220, a third rank 230, and a fourth rank 240.

Each of ranks 210 to 240 comprises a mode register 211, a test-mode (tmode) register 212, and a nonvolatile memory 213. Mode register 211 is programmed by the MRS signal, and tmode register 212 is programmed by the tMRS signal. Various electrical parameters of ranks 210 to 240 can be tuned or calibrated. Tmode register 212 is an extended register for testing the electrical parameters in a test mode of memory system 1. Nonvolatile memory 213 stores tuning/calibration results of the electrical parameters by the OTP signal. Nonvolatile memory 213 may be, for example, a one-time programmable (OTP) memory. Nonvolatile memory 213 stores the tuning/calibration results of the electrical parameters using an anti-fuse approach.

In the described example, the electrical parameters are parameters for controlling operations of ranks 210 to 240. For example, the parameters may be parameters for controlling AC timing. The parameters for controlling AC timing may comprise, for example, a clock timing parameter, such as an average clock cycle or average clock pulsewidth, DQ/DQS delay, a read timing parameter, such as DQ output setup time or DQ output hold time, a write timing parameter, such as DQ input setup time or DQ input hold time, a command timing parameter, such as address/control input setup time or address/control input hold time, and a register timing parameter, such as mode register write cycle or state register read cycle. Certain details of electrical parameters for controlling AC timing are described, for instance, in "Wide I/O Single Data Rate" of JEDEC Standard No. 229. The tuning/calibration results of the electrical parameters stored in nonvolatile memory 213 can be transferred to a circuit of generating AC timing during a power-up time of memory module 200.

Respective ranks 210 to 240 are connected to controller 100 through logical/physical channels. In memory system 1, respective ranks 210 to 240 are connected to controller 100 through one channel, but aspects of the inventive concept are not limited thereto. For example, one channel may be assigned to each of the plurality of ranks. Each channel may have its own clock signal CLK, select signal CS, command signal CMD, and data signals DQ and DQS.

Select signal CS comprises a first select signal selecting memory chips of first rank 210, a second select signal selecting memory chips of second rank 220, a third select signal selecting memory chips of third rank 230, and a fourth select signal selecting memory chips of fourth rank 240. Memory chips of ranks receiving select signal CS perform access operations, while memory chips of ranks not receiving select signal CS do not perform access operations. As described above, command signal CMD comprises the MRS signal, the tMRS signal and the OTP signal. Data signals DQ and DQS may have tri-states of a high level, a low level, and high impedance. Meanwhile, in memory system 1, various signals, in addition to clock signal CLK, select signal CS, command signal CMD and data signals DQ and DQS, may be propagated or transmitted/received between controller 100 and memory module 200.

FIGS. 2 to 7 are block diagrams for explaining various electrical parameters of the memory system of FIG. 1. Although various electrical parameters are described with reference to FIGS. 2 to 7, the inventive concept is not limited to these parameters.

Figure 2:
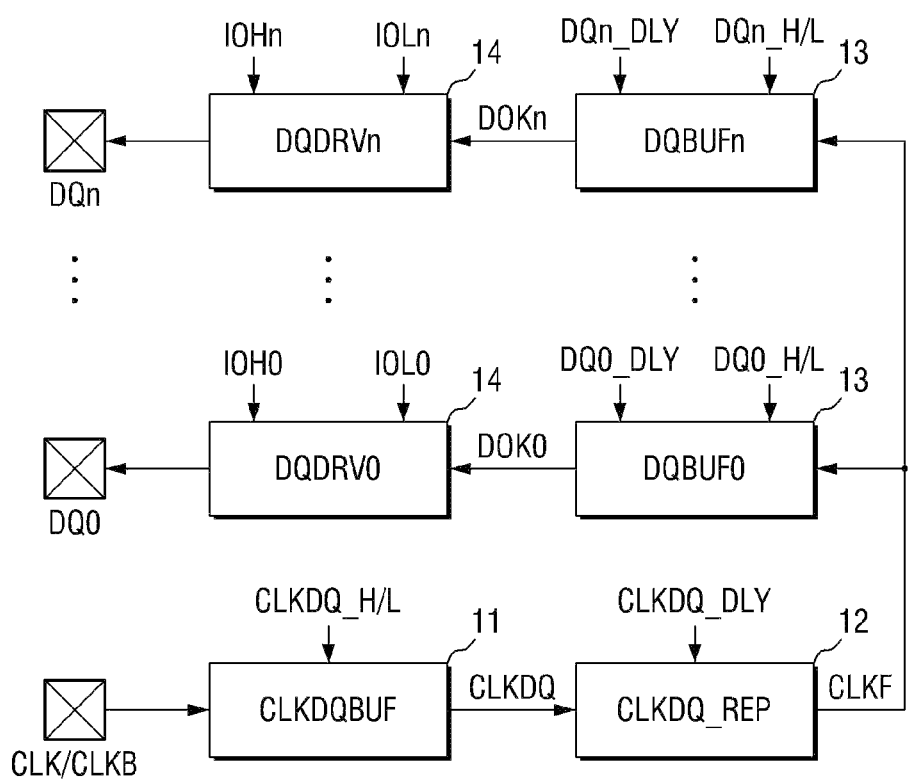
FIG. 2 is a block diagram for explaining various electrical parameters of the memory system of FIG. 1.

Referring to FIG. 2, each of ranks 210 to 240 comprises a clock buffer 11 (CLKDQBUF), a clock repeater 12 (CLKDQ_REP), DQ buffers 13 (DQBUF0~DQBUFn), and DQ drivers 14 (DQDRV0~DQDRVn).

Clock buffer 11 receives clock signals CLK/CLKB from controller 100 and outputs a CLKDQ generated by adjusting a duty of clock signals CLK/CLKB. Here, the duty is a pulse-width ratio per cycle of a signal. CLKDQ is a clock signal input to DQ buffers 13. Clock buffer 11 adjusts the duty by controlling a rising/falling time of CLKDQ according to a CLKDQ_H/L parameter.

Clock repeater 12 reproduces the attenuated CLKDQ. Clock repeater 12 outputs a CLKF signal obtained by adjusting a propagation delay time of CLKDQ. Clock repeater 12 adjusts a propagation delay time of the CLKDQ according to a CLKDQ_DLY parameter.

DQ buffers 13 receive the CLKF signal from clock repeater 12. Each of DQ buffers 13 outputs a DOKn signal obtained by adjusting the propagation delay time and duty of data signal DQ. Each of DQ buffers 13 adjusts the propagation delay time of the DOKn signal by the DQn_DLY parameter, and adjusts the duty of the DOKn signal by controlling the rising/falling time of DOKn signal by the DQn_H/L parameter.

DQ drivers 14 receive the DOKn signal from DQ buffers 13. Each of DQ drivers 14 adjusts a pull-up current by an IOHn parameter and adjusts a pull-down current by an IOLn parameter.

Figure 3:
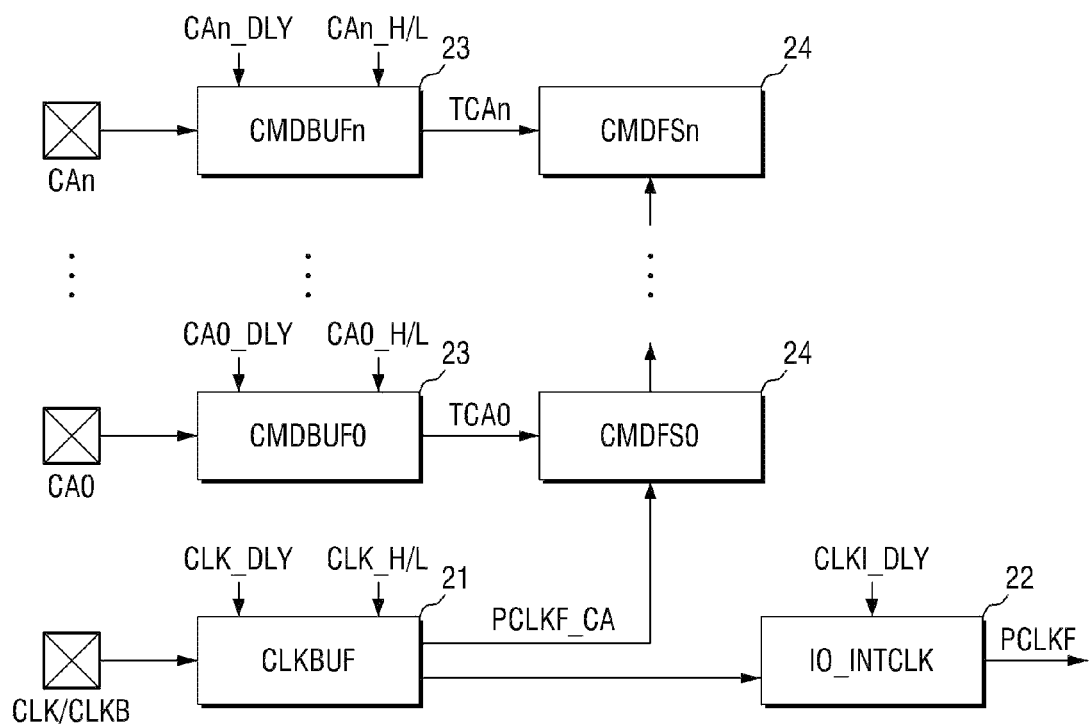
FIG. 3 is a block diagram for explaining various electrical parameters of the memory system of FIG. 1.

Referring to FIG. 3, each of ranks 210 to 240 comprises a clock buffer 21 (CLKBUF), an internal clock buffer 22 (IO_INTCLK), command buffers 23 (CMDBUF0~CMDBUFn), command flipflops 24 (CMDFS0~CMDFSn).

Clock buffer 21 receives clock signals CLK/CLKB from controller 100. Clock buffer 21 outputs a PCLKF_CA signal obtained by adjusting a propagation delay time and duty of clock signals CLK/CLKB. Clock buffer 21 adjusts the propagation delay time of the PCLKF_CA signal according to a CLK_DLY parameter and adjusts the duty of the PCLKF_CA signal by controlling the rising/falling time of the PCLKF_CA signal according to a CLK_H/L.

Internal clock buffer 22 receives the PCLKF_CA signal from clock buffer 21. The PCLKF_CA signal comprises sampling clocks of flipflops other than command flipflops 24.

Internal clock buffer 22 outputs a PCLKF signal obtained by readjusting the propagation delay time of the PCLKF_CA signal. Internal clock buffer 22 adjusts the propagation delay time of the PCLKF signal by the CLKI_DLY parameter.

Command buffers 23 receive command signals CA0 to CAn from controller 100. Command signals CA0 to CAn comprise address signals. Each of command buffers 23 outputs a TCAn signal obtained by adjusting the propagation delay time and duty of each of command signals CA0 to CAn. Each of command buffers 23 adjusts the propagation delay time of the TCAn signal according to a CAn_DLY parameter and adjusts the duty of of the TCAn signal by controlling the rising/falling time of the TCAn signal according to a CAn_H/L parameter.

Command flipflops 24 receive the TCAn signal from command buffers 23 and the PCLKF_CA signal is input from clock buffer 21. Each of command flipflops 24 convert the TCAn signal using the PCLKF_CA signal as a sampling clock.

Figure 4:
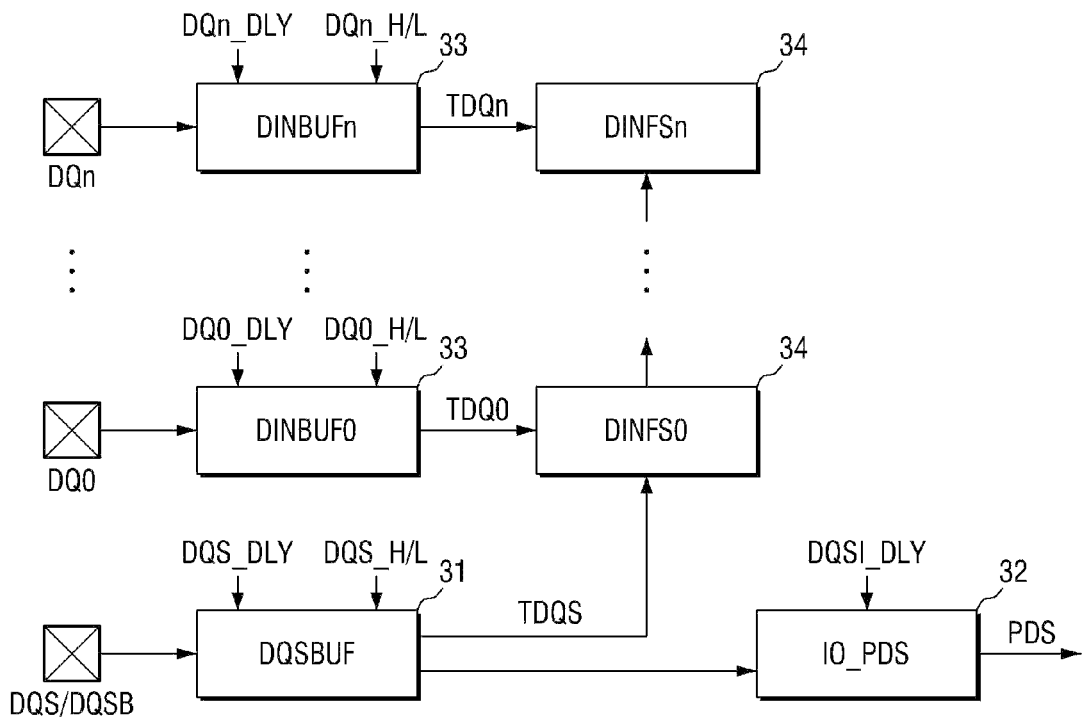
FIG. 4 is a block diagram for explaining various electrical parameters of the memory system of FIG. 1.

Referring to FIG. 4, each of ranks 210 to 240 comprises DIN buffers 33 (DINBUF0 to DINBUFn), DIN flipflops 34 (DINFS), a DQS buffer 31 (DQSBUF), and a PDS block 32 (PDS).

DIN buffers 33 receive data signals DQ0 to DQn from controller 100. DIN buffers 33 output a TDQn signal obtained by adjusting the propagation delay time and duty of data signals DQ0 to DQn. DIN buffers 33 adjust the propagation delay time of the TDQn signal according to a DQn_DLY parameter and adjust the duty of the TDQn signal by controlling the rising/falling time of the TDQn signal according to a DQn_H/L parameter.

DQS buffer 31 receives data signal DQSs DQS/DQSB from controller 100. DQS buffer 31 outputs a Tdata signal DQS obtained by adjusting the propagation delay time and duty of data signal DQS DQS/DQSB. DQS buffer 31 adjusts the propagation delay time and duty of Tdata signal DQS according to a DQS_DLY parameter and adjusts the duty of Tdata signal DQS by controlling the rising/falling time of Tdata signal DQS according to a DQS_H/L parameter.

PDS block 32 receives Tdata signal DQS and outputs a PDS signal obtained by adjusting the propagation delay time of Tdata signal DQS. PDSblock 32 adjusts the propagation delay time of the PDS signal by a DQSI_DLY parameter.

DIN flipflops 34 receive the TDQn signal from DIN buffers 33 and Tdata signal DQS from DQS buffer 31. Each of DIN flipflops 34 converts the TDQn signal using Tdata signal DQS as a sampling clock.

Figure 5:
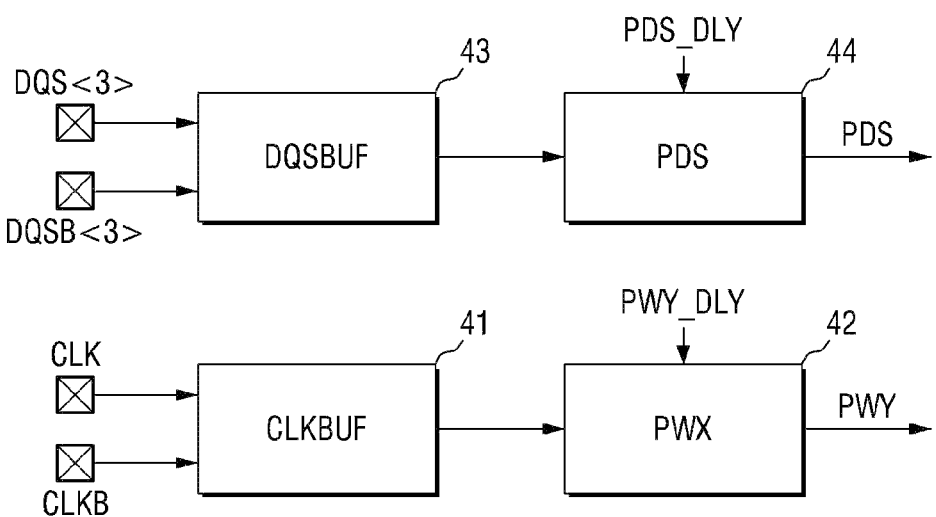
FIG. 5 is a block diagram for explaining various electrical parameters of the memory system of FIG. 1.

Referring to FIG. 5, each of ranks 210 to 240 comprises a DQS buffer 43 (DQSBUF), a PDS block 44 (PDS), a clock buffer 41 (CLKBUF), and a PWX block 42 (PWX). DQS buffer 43 receives DQS<3> and DQSB<3> signals from controller 100. DQS buffer 43 adjusts and outputs the propagation delay time of each of the DQS<3> and DQSB<3> signals. PDS block 44 receives adjusted signals from DQS buffer 43, adjusts the propagation delay time and outputs a PDS signal. PDS block 44 adjusts the propagation delay time of the PDS signal by a PDS_DLY parameter.

Clock buffer 41 receives clock signals CLK and CLKB from controller 100. Clock buffer 41 adjusts the propagation delay time of each of clock signals CLK and CLKB and outputs adjusted signals. PWX block 42 receives the adjusted signals from clock buffer 41, adjusts the propagation delay time, and outputs a PWX signal. PWX block 42 adjusts the propagation delay time of the PWY signal by a PWY_DLY parameter.

Figure 6:
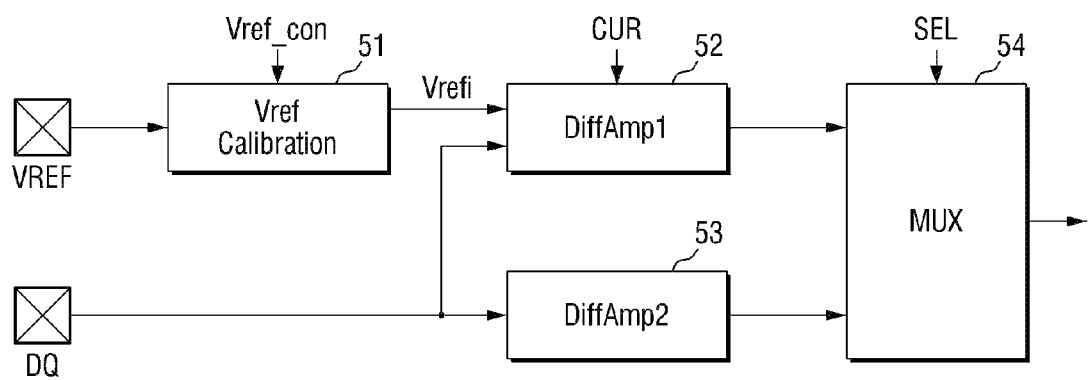
FIG. 6 is a block diagram for explaining various electrical parameters of the memory system of FIG. 1.

Referring to FIG. 6, each of ranks 210 to 240 comprises a reference voltage (Vref) calibration block 51, comparators 52 and 53, and a MUX 54.

A reference voltage (VREF) is input to Vref calibration block 51, and Vref calibration block 51 calibrates reference voltage VREF and ouputs a Vrefi voltage. Vref calibration block 51 increases or decreases the level of the Vrefi voltage by a Vref_con parameter.

The Vrefi voltage and data signal DQ are input to the first comparator 52 (DiffAmp1), and data signal DQ is input to the second comparator 53 (DiffAmp2). Here, second comparator 53 can be replaced by an inverter. First comparator 52 increases or decreases the current according to a CUR parameter. Outputs of first comparator 52 and second comparator 53 are input to MUX 54, and MUX 54 selects the type of an input buffer by a SEL parameter.

Figure 7:
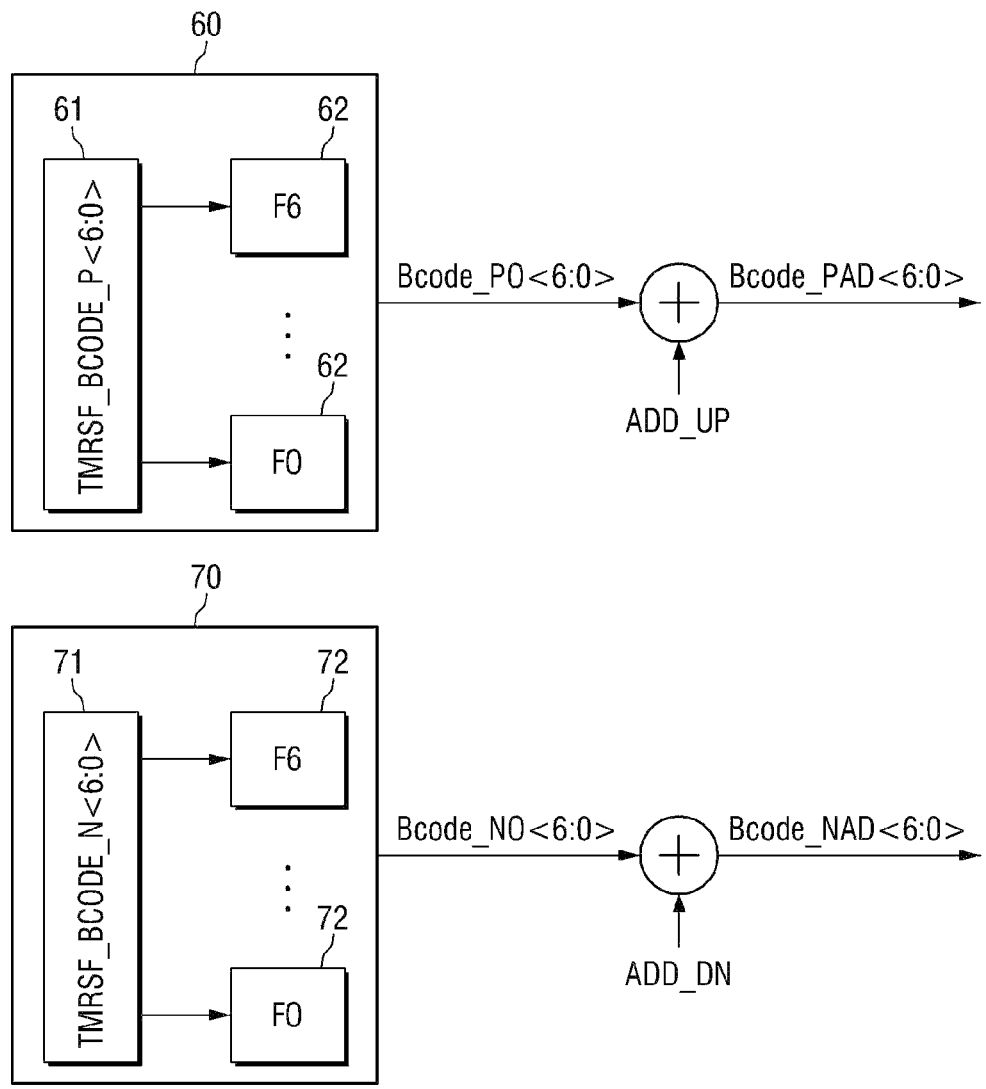
FIG. 7 is a block diagram for explaining various electrical parameters of the memory system of FIG. 1.

Referring to FIG. 7, each of ranks 210 to 240 comprises a first calibration block 60 and a second calibration block 70. First calibration block 60 performs a pull-up operation, and second calibration block 70 performs a pull-down operation.

First calibration block 60 comprises a plurality of flipflops 62, and TMRSF_BCODE_P<6:0> bits 61 are input to respective flipflops 62. First calibration block 60 outputs calibrated Bcode_PO<6:0>. The bit value of Bcode_PO<6:0> is increased by TMRSF_BCODE_P<6:0>. The bit value of Bcode_PAD<6:0> is increased again by an ADD_UP parameter.

Second calibration block 70 comprises a plurality of flipflops 72, and TMRSF_BCODE_N<6:0> bits 71 are input to respective flipflops 72. First calibration block 70 outputs calibrated Bcode_NO<6:0>. The bit value of Bcode_NO<6:0> is increased by TMRSF_BCODE_N<6:0>. The bit value of Bcode_NAD<6:0> is increased again by an ADD_DN parameter.

Meanwhile, in memory system 1, controller 100 and memory module 200 may be packaged using through silicon vias (TSVs) or micro bump balls. Here, if contact resistance of TSV or micro bump ball is high, an increase in the data input/output delay can be detected, and the TSV or micro bump ball can be replaced by extra normal TSV or micro bump ball.

Tuning/calibration of the electrical parameters may be performed in units of pins of memory module 200 by an MRS signal or a tMRS signal or in units of ranks. In addition, where one channel is allocated to a plurality of ranks, tuning/calibration of the electrical parameters may be performed in units of channels. The tuning/calibration of the electrical parameters may also be performed on all components of memory module 200. Nonvolatile memory 213 may store tuning/calibration results of the electrical parameters in various units.

Hereinafter, a method of tuning various electrical parameters, for example, data signals, will be described with regard to memory system 1. The method will be described with respect to a memory system comprising a plurality of ranks.

In memory system 1, ranks 210 to 240 share input/output lines. The input/output lines may comprise, for example, a data signal DQ line and a data signal DQS line. Meanwhile, different data signals DQ and DQS are output from the input/output lines of respective ranks 210 to 240 according to the process voltage temperature (PVT), and collision may occur between data signals DQ and DQS of respective ranks 210 to 240. To this end, there are standards for tuning data signals between the plurality of ranks in the multi-rank memory system. Examples of these standards are described in "Wide I/O Single Data Rate" of JEDEC Standard No. 229. The standards provide methods for tuning data signals between the plurality of ranks in the multi-rank memory system. In those methods, the tuned values of the data signals cannot be fixed or stored, so tuning of the data signals between the plurality of ranks is repeatedly performed every time the multi-rank memory system is in a power-up mode. In addition, even if tuned values of the data signals are stored in a separate chip of the multi-rank memory system, the process of propagating the tuned values of the data signals stored in the chip to the memory device during a power-up time of the multi-rank memory system is repeatedly performed using the MRS signal.

Memory module 200 of memory system 1 comprises a nonvolatile memory 213 storing tuning results of delays of data signals DQ and DQS. Accordingly, at a testing time of memory system 1, the tuning results of delays of data signals DQ and DQS between the plurality of ranks 210 to 240 are stored in nonvolatile memory 213, and the same process may not be repeated where memory system 1 is mounted.

In addition, minute tuning of data signals DQ and DQS between ranks 210 to 240 is performed according to environmental changes where memory system 1 is mounted. The tuning results of delays of data signals DQ and DQS stored in nonvolatile memory 213 are transferred to a circuit generating data signals DQ and DQS during the power-up time of memory module 200. Circuits generating data signals DQ and DQS may include, for example, a DQ buffer that adjusts a propagation delay of data signal DQ and a DQS buffer that adjusts a propagation delay of data signal DQS. Due to the process of transferring the tuned values of data signals DQ and DQS to memory module 200, a booting speed of memory module 200 may be improved.

FIGS. 8 to 12 are tables illustrating operations of a mode register of the memory system of FIG. 1. Various values are programmed to mode register 211. The respective values are programmed to mode register 211 by an MRS signal. Mode register 211 is programmed where memory system 1 is reset or initialized, and default values thereof are not defined.

Referring to FIG. 8, mode register 211 is divided into a plurality of fields according to functionality and/or mode. For example, mode register 211 may be divided into mode registers MR0 to MR7. In particular, tuning of data signals DQ and DQS is performed by modifying bits A7 to A0 of mode register MR5.

Referring to FIG. 9, the number of delay steps of memory system 1 is determined by a bit string DQ<17:16>. Bit string DQ<17:16> comprises bits of a state register (not shown) of each of ranks 210 to 230. Where bit string DQ<17:16> of the state register is set to "00," no delay step is provided. Where bit string DQ<17:16> of the state register is set to "01," 8 delay steps are provided. Where bit string DQ<17:16> of the state register is set to "10," 16 delay steps are provided. Where bit string DQ<17:16> of the state register is set to "11," 32 delay steps are provided. Here, the step size is not defined but is variable.

As described above, data signal tuning of memory system 1 is controlled by mode register MR5. Interleaving of DQ delay and DQS delay is determined by bit string A<3:0> of mode register MR5. Here, bit strings A<16> and BA<1:0> of mode register MR5 are set to "101."

Referring to FIG. 10, the DQ delay is supplied to data signal DQ from a positive going edge from a clock. Where bit string A<1:0> of mode register MR5 is set to "00," the DQ delay is not changed. Where bit string A<1:0> of mode register MR5 is set to "01," the DQ delay is increased by 1 element. Where bit string A<1:0> of mode register MR5 is set to "10," the DQ delay is decreased by 1 element. Where bit string A<1:0> of mode register MR5 is set to "11," all of the DQ delays are removed.

Referring to FIG. 11, the DQ delay is supplied to data signal DQ from a negative going edge from a clock. Where bit string A<3:2> of mode register MR5 is set to "00," the DQS delay is not changed. Where bit string A<3:2> of mode register MR5 is set to "01," the DQS delay is increased by 1 element. Where bit string A<3:2> of mode register MR5 is set to "10," the DQS delay is decreased by 1 element. Where bit string A<3:2> of mode register MR5 is set to "11," all of the DQS delays are removed.

Controlling of tuning pulses is determined by bit string A<7:4> of mode register MR5. Here, bit string A<16> and bit string BA<1:0> of mode register MR5 is set to "101." The tuning pulses are training pulses for tuning data signals DQ and DQS of memory system 1. Each rank transfers training pulses of the same phase from different DQ and DQS pins.

Referring to FIG. 12, where bit string A<7:4> of mode register MR5 is set to "0001," training pulses are propagated as data signals DQ8 and DQS0. Where bit string A<7:4> of mode register MR5 is set to "0010," training pulses are propagated as data signals DQ24 and DQS1. Where bit string A<7:4> of mode register MR5 is set to "0100," training pulses are propagated as data signals DQ40 and DQS2. Where bit string A<7:4> of mode register MR5 is set to "1000," training pulses are propagated as data signals DQ56 and DQS3. Where bit string A<7:4> of mode register MR5 is set to "0000," normal DQ/DQS functionality is performed.

CK/2 indicates a value obtained by dividing the frequency of a clock by 2. +CK/2 indicates a value obtained by triggering an edge transition by a rising edge of a clock and dividing the triggered edge transition by 2. −CK/2 indicates a value obtained by triggering an edge transition by a falling edge and dividing the triggered edge transition by 2.

Meanwhile, tmode register 212 of memory system 1 operates in substantially the same manner as mode register 211. In certain alternative implementations, tmode register 212 may be programmed by a tMRS signal transferred from a separate device (not shown) instead of internal controller 100 of memory system 1.

Figure 13A:
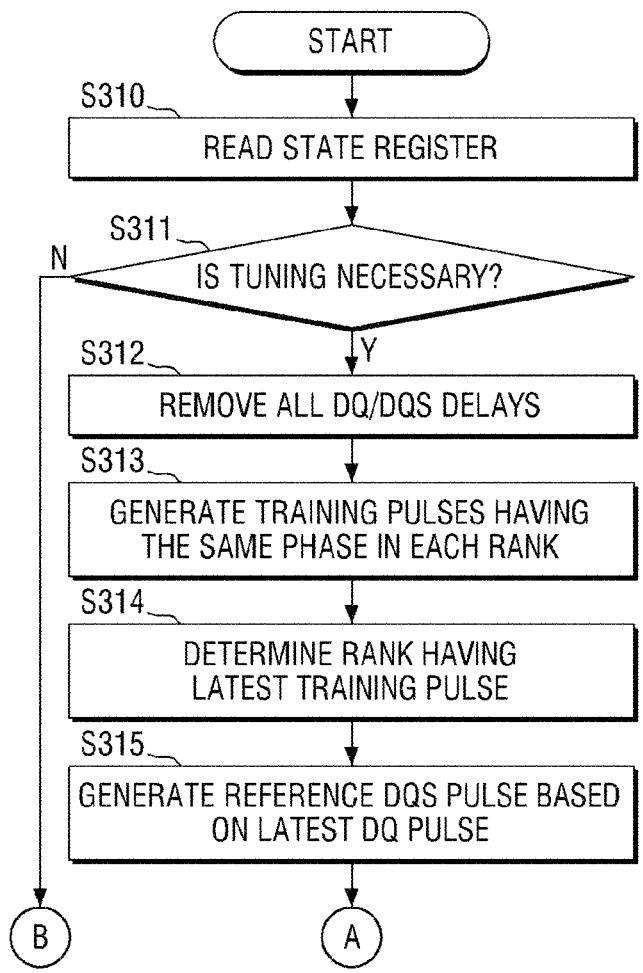
FIG. 13A is a flowchart illustrating a tuning method for data signals in a memory system according to an embodiment of the inventive concept.
Figure 13B:
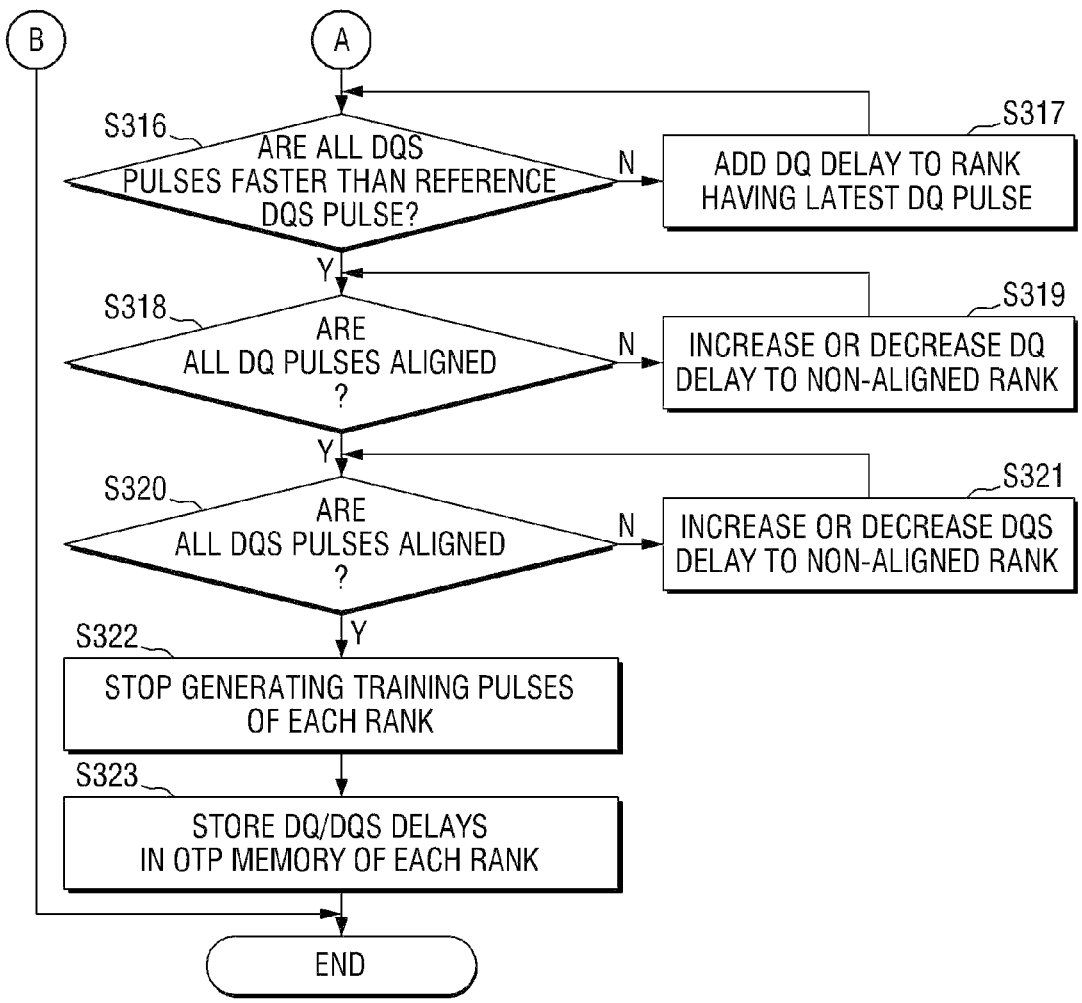
FIG. 13B is a flowchart further illustrating the tuning method of FIG. 13A.

FIGS. 13A and 13B are flowcharts illustrating a tuning method for data signals in a memory system according to an embodiment of the inventive concept. FIGS. 14 through 17 are timing diagrams for the tuning method of FIGS. 13A and 13B. For explanation purposes, the tuning method will be described with reference to memory system 1 of FIG. 1, although it is not limited to this system.

Referring to FIGS. 13A and 13B, controller 100 reads state registers of ranks 210 to 240 (S310) and determines whether tuning of DQ/DQSs is necessary (S311). Next, if tuning of data signals DQ/DQS is necessary, controller 100 resets ranks 210 to 240 by removing all of DQ delays and DQS delays of ranks 210 to 240 (S312). Here, first to fourth ranks 210 to 240 are all selected by a select signal CS, and the bit string A<7:0> of each of ranks 210 to 240 is set to "00001111". Meanwhile, bit strings A<16> and BA<1:0> of mode register MR5 of each of ranks 210 to 240 is set to "101."

Figure 14:
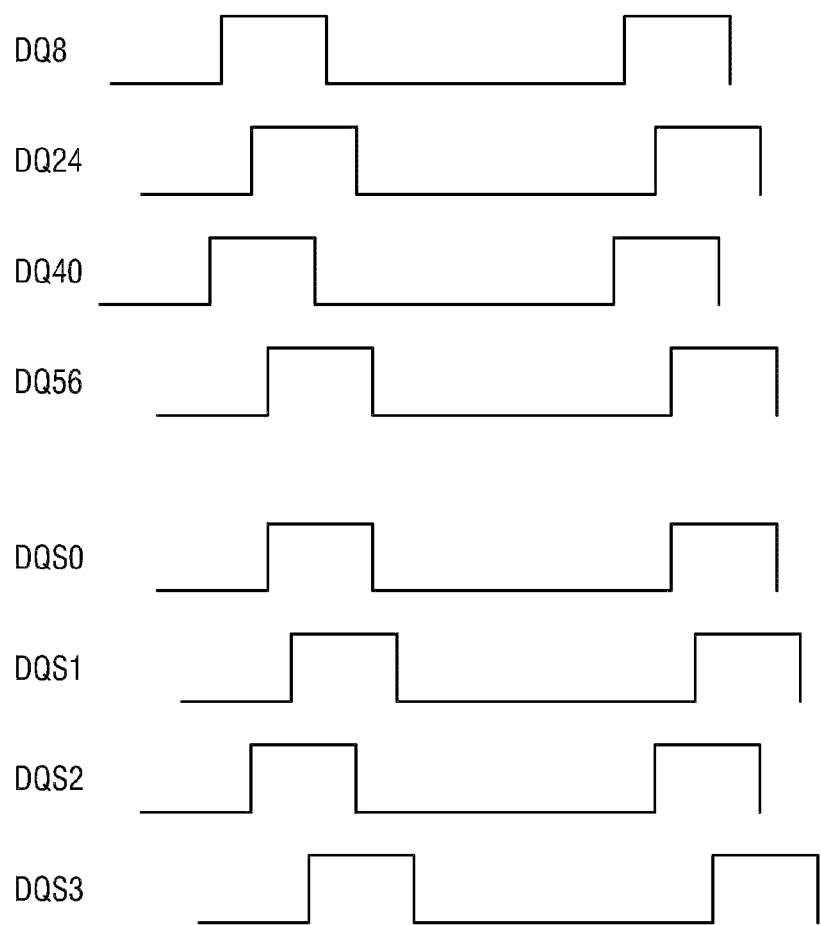
FIG. 14 is a timing diagram for the tuning method of FIGS. 13A and 13B.

Next, controller 100 controls ranks 210 to 240 to generate training pulses of the same phase from different DQ and DQS pins using the MRS signal (S313). For example, first rank 210 propagates DQ/DQS pulses of data signals DQ8 and DQS0, second rank 220 propagates DQ/DQS pulses of data signals DQ24 and DQS1, third rank 230 propagates DQ/DQS pulses of data signals DQ40 and DQS2, and fourth rank 240 propagates DQ/DQS pulses of data signals DQ56 and DQS3. Here, first rank 210 is selected by select signal CS to set bit strings A<7:0> of mode register MR5 to "00010000,", second rank 220 is selected to set bit strings A<7:0> of mode register MR5 to "00100000,", third rank 230 is selected to set bit string A<7:0> of mode register MR5 to "01000000," and fourth rank 240 is selected to set bit string A<7:0> bits of mode register MR5 to "10000000." Meanwhile, bit strings A<16> and BA<1:0> of mode register MR5 of each of ranks 210 to 240 are set to "101." As shown in FIG. 14, DQ pulses of the same phase are propagated as data signals DQ8, DQ24, DQ40, and DQ56, and DQS pulses of the same phase are propagated as data signals DQS0, DQS1, DQS2, and DQS3. However, none of the pulses are aligned and pulses having different phases are generated.

Figure 15:
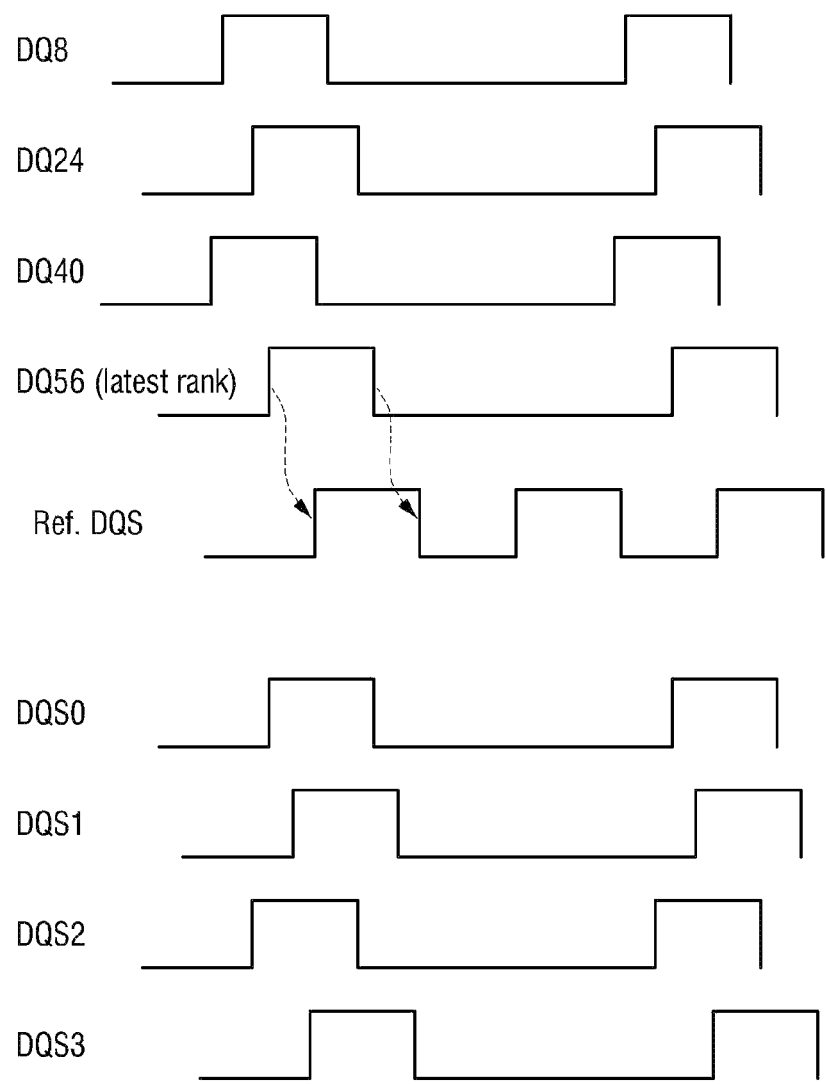
FIG. 15 is a timing diagram for the tuning method of FIGS. 13A and 13B.

Next, controller 100 determines a rank having a latest DQ pulse using a phase differentiation circuit (not shown) (S314). Controller 100 comprising the phase differentiation circuit determines relative arrival timing of different DQ/DQS pulses transferred from memory module 200. As shown in FIG. 15, a pulse of data signal DQ56 among data signals DQ8, DQ24, DQ40, and DQ56 is determined as the latest DQ pulse.

Subsequently, memory module 200 generates a reference DQS pulse from a reference DQS generation circuit (not shown) based on the latest DQ pulse (S315). Here, the reference DQS pulse is generated to have the same frequency as the latest DQ pulse and to have edges positioned at the center of high and low times of DQ.

The reference DQS pulse is generated to have a phase difference of 90 degrees from DQ56 pulse that is the latest DQ pulse. Next, controller 100 determines whether DQS pulses of all of ranks 210 to 240 are faster than the reference DQS pulse (S316).

Next, if DQS pulses of all of ranks 210 to 240 are not faster than the reference DQS pulse, controller 100 adds a DQ delay to the rank having the latest DQ pulse (S317). Then, reference DQS pulses are repeatedly generated based on the latest DQ pulse. Delays are repeatedly added to the rank having the latest DQ pulse until DQS pulses of all of ranks 210 to 240 become faster than the reference DQS pulse. Here, the rank of the latest DQ pulse is selected by select signal CS to set bit string A<7:0> of mode register MR5 of the rank to "00000001." Meanwhile, bit strings A<16> and BA<1:0> of mode register MR5 of the rank are set to "101."

Subsequently, if DQS pulses of all of ranks 210 to 240 are faster than the reference DQS pulse, controller 100 determines whether DQ pulses of all of ranks 210 to 240 are aligned with the latest DQ pulse (S318).

Subsequently, if DQ pulses of all of ranks 210 to 240 are not aligned with the latest DQ pulse, controller 100 increases or decreases DQ delays to ranks that are not aligned with the latest DQ pulse (S319). Here, the rank that is not aligned is selected by select signal CS to then select A<7:0> bits of mode register MR5 to "00000001" or "00000010." Meanwhile, bit strings A<16> and BA<1:0> of mode register MR5 of the rank are set to "101." As shown in FIG. 16, DQ delays are increased or decreased to respective ranks 210 to 240 to align pulses of data signals DQ8, DQ24 and DQ40 with the latest pulse of data signal DQ56.

Figure 17:
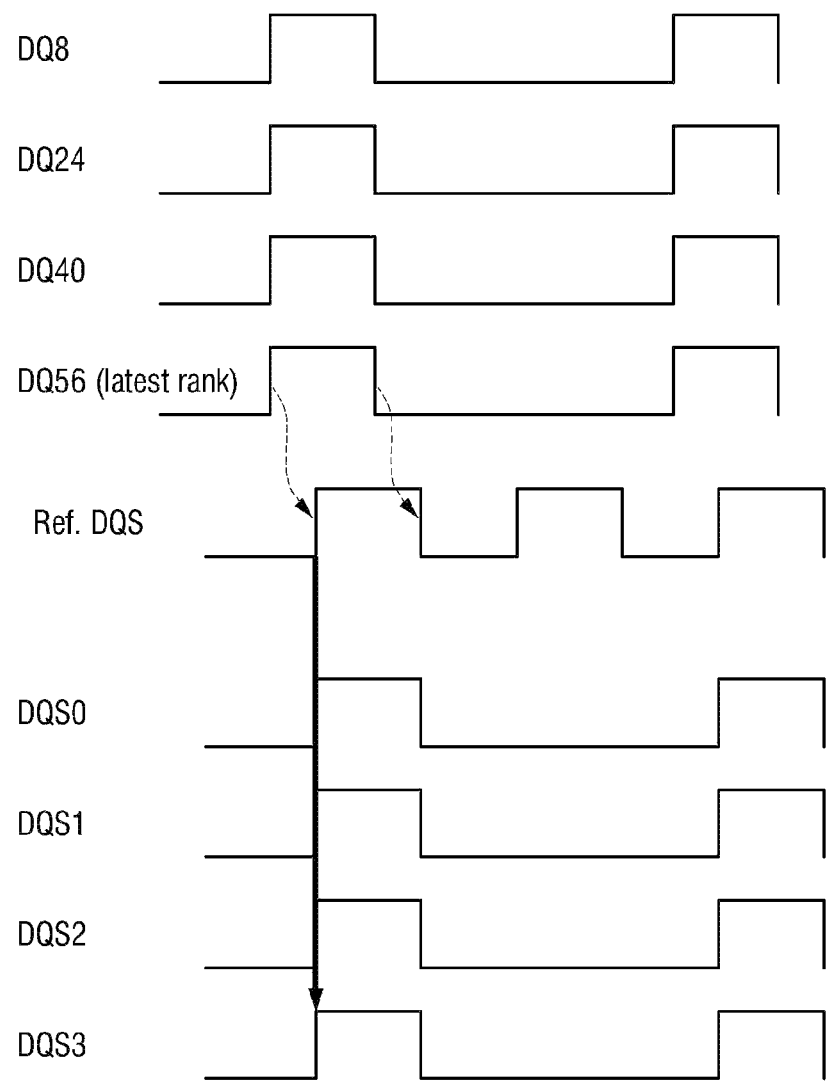
FIG. 17 is a timing diagram for the tuning method of FIGS. 13A and 13B.

Next, if DQ pulses of all of ranks 210 to 240 are aligned with the latest DQ pulse, controller 100 determines whether DQS pulses of all of ranks 210 to 240 are aligned with the reference DQS pulse (S320). Thereafter, if DQS pulses of all of ranks 210 to 240 are not aligned, controller 100 increases or decreases DQS delay to the ranks that are not aligned with the reference DQS pulse (S321). Here, the rank that is not aligned is selected by select signal CS to set A<7:0> bits of mode register MR5 of the rank to "00000100" or "00001000." Meanwhile, A<16> and BA<1:0> bits of mode register MR5 of the rank are set to "101." As shown in FIG. 17, DQS delays are increased or decreased to respective ranks 210 to 240 to align pulses of data signals DQ8, DQ24 and DQ40 with the reference DQS pulse.

Next, if DQS pulses of all of ranks 210 to 240 are aligned, controller 100 controls ranks 210 to 240 to stop generating training pulses and performs normal DQ/DQS functionality (S322). Here, first to fourth ranks 210 to 240 are all selected by select signal CS to set A<7:0> bits of each of ranks 210 to 240 to "00000000." Meanwhile, A<16> and BA<1:0> bits of mode register MR5 of the rank MR5 are set to "101." Next, controller 100 stores data signal tuning results, that is to say, DQ delays and DQS delays, in nonvolatile memory 211 of each of ranks 210 to 240 (S323).

In the above-described embodiment of the inventive concept, memory system 1 may be provided as a system in package (SIP). If memory system 1 is provided as the SIP, controller 100 may be a system on chip (SOC).

The foregoing is illustrative of embodiments and is not to be construed as limiting thereof. Although a few embodiments have been described, those skilled in the art will readily appreciate that many modifications are possible in the embodiments without departing from scope of the inventive concept as defined in the claims.

What is claimed is:

1. A tuning method for a memory device, comprising:
    operating least two memory ranks sharing input/output lines to generate pulses having a same phase from different DQ and DQS pins;
    generating a reference DQS pulse having a phase difference of 90 degrees from a latest DQ pulse among DQ pulses of the at least two memory ranks;
    aligning phases of DQ pulses of the at least two memory ranks by increasing or decreasing DQ delays based on the latest DQ pulse;
    aligning phases of DQS pulses with the at least two ranks by increasing or decreasing DQS delays based on the reference DQS pulse; and
    storing increasing or decreasing results of the DQ delay and the DQS delay in a nonvolatile memory.

2. The tuning method of claim 1, further comprising transferring the increasing or decreasing results of the DQ delay and the DQS delay to a circuit configured to generate DQ pulses of the at least two memory ranks or a circuit generating DQS pulses, during a power-up time.

3. The tuning method of claim 1, further comprising storing the increasing or decreasing results of the DQ delay and the DQS delay in the nonvolatile memory using an anti-fuse technique.

4. The tuning method of claim 1, wherein each of the at least two memory ranks comprises a plurality of dynamic random access memory (DRAM) chips.

5. A memory device comprising:
    at least one memory rank comprising a plurality of memory chips;
    at least one mode register configured to store bits used to tune electrical parameters of data signals of the at least two ranks output through the input/output lines;
    a controller configured to tune the electrical parameters based on the stored bits in the at least one mode register, the electrical parameters comprising alternating current (AC) timing parameters; and
    at least one nonvolatile memory disposed in at least one of the at least two memory ranks and configured to store the electrical parameters.

6. The memory device of claim 5, wherein the AC timing parameters indicate data signal DQ timing and data signal DQS timing.

7. The memory device of claim 5, wherein the tuned electrical parameters are transferred to a circuit generating the AC timing during a power-up time.

8. The memory device of claim 5, wherein the electrical parameters comprise a DQ delay and a DQS delay.

9. The memory device of claim 5, wherein the nonvolatile memory is a one-time programmable (OTP) memory.

\* \* \* \* \*